United States Patent [19]

Goto

[11] Patent Number: 5,124,879

[45] Date of Patent: Jun. 23, 1992

[54] ELECTROSTATIC DRIVE DEVICE AND CIRCUIT FOR CONTROLLING SAME

[75] Inventor: Hiroshi Goto, Yamatokooriyama, Japan

[73] Assignee: Omron Corporation, Kyoto, Japan

[21] Appl. No.: 537,140

[22] Filed: Jun. 13, 1990

[30] Foreign Application Priority Data

Jul. 12, 1989 [JP] Japan .................. 1-180063

[51] Int. Cl.$^5$ .......................................... H02N 15/00
[52] U.S. Cl. .................... 361/233; 310/309; 318/116
[58] Field of Search ............... 361/234, 233; 269/8, 269/903; 340/870.3, 870.37; 310/309, 12; 318/116, 135

[56] References Cited

U.S. PATENT DOCUMENTS

| 3,686,593 | 8/1972 | Zakaria | 310/309 |
| 3,952,215 | 4/1976 | Sakitani | 318/116 |
| 4,667,110 | 5/1987 | Kariya | 361/234 |
| 5,055,731 | 10/1991 | Nihei et al. | 310/309 |

FOREIGN PATENT DOCUMENTS 2800342 7/1978 Fed. Rep. of Germany ...... 361/233

Primary Examiner—Howard L. Williams
Assistant Examiner—Richard Elms
Attorney, Agent, or Firm—Dickstein, Shapiro & Morin

[57] ABSTRACT

An electrostatic drive device includes at least one fixed electrode plate provided on a fixed portion, and at least one movable electrode plate provided on a movable portion resiliently supported on the fixed portion so as to move freely. The fixed electrode plate and movable electrode plate are disposed as to oppose each other in parallel relation, and the movable portion is driven by an electrostatic force produced by applying a voltage across the fixed electrode plate and the movable electrode plate.

2 Claims, 5 Drawing Sheets

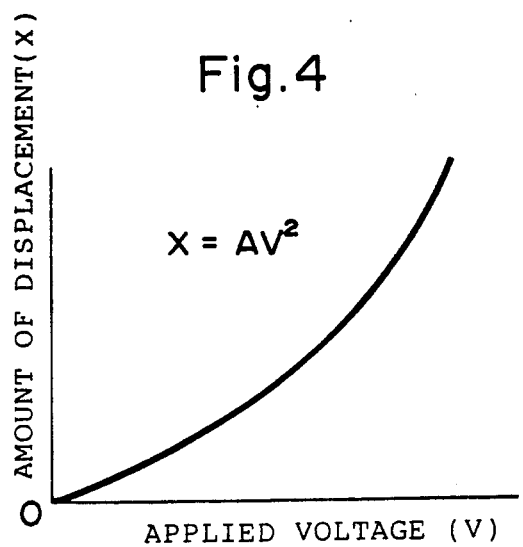
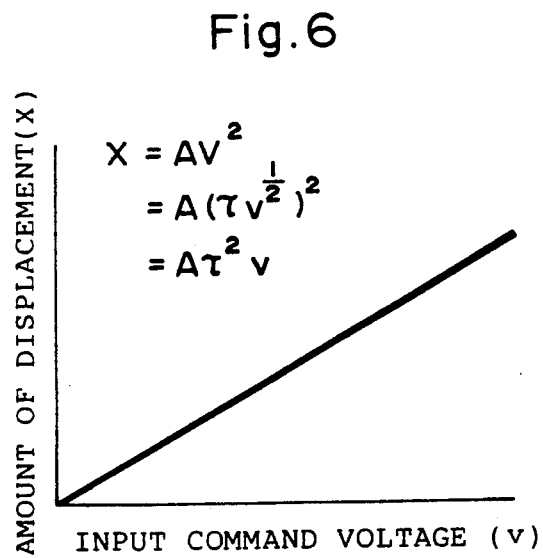

ELECTROSTATIC DRIVE DEVICE AND CIRCUIT FOR CONTROLLING SAME

BACKGROUND OF THE INVENTION

1. Field of the Invention

This invention relates to an electrostatic drive device applicable to a semiconductor exposure device, a precision processing machine, a precision measurement device, etc., and to a circuit for controlling such an electrostatic drive device.

2. Description of the Related Art

As shown in FIG. 8, an example of a conventional drive device applicable to a semiconductor exposure device comprises a fixed portion 2 provided with a permanent magnet 1, and a movable portion 6 resiliently supported on the fixed portion 2 by four coil springs 3 and having an iron core 5 on which a coil 4 is wound. The iron core 5 is arranged to oppose the permanent magnet 1 and is capable of being attracted thereto.

The iron core 5 is attracted to and repelled from the permanent magnet 1 by a magnetic force produced by passing a current through the coil 4, thereby driving, i.e., moving and displacing, the movable portion 6.

However, since the coil 4 in this drive device produces heat, not only is a large amount of power consumed but the movable portion 6 and fixed portion 2 also experience thermal deformation, making it difficult to achieve highly accurate positioning. In addition, since the permanent magnet 1 and iron core 5 on which the coil 4 is wound are required, it is difficult to make the device small in size and light in weight.

In an attempt to solve these problems, a drive device of the kind shown in FIG. 9 has been proposed, in which a piezoelectric element 7 is arranged between the fixed portion 2 and movable portion 6, with the movable portion 6 being driven by deformation of the piezoelectric element 7.

However, owing to hysteresis or creep exhibited by the piezoelectric element 7, the displacement of the element is not constant and the amount of displacement is likely to change. Consequently, it is essential that a displacement sensor be provided and that the output signal of the sensor be fed back to achieve control. The result is a more complicated control system.

SUMMARY OF THE INVENTION

An object of the present invention is to provide a compact, light-weight electrostatic drive device capable of highly accurate positional control with little power consumption, as well as a circuit for controlling the device.

According to the present invention, the foregoing object is attained by providing an electrostatic drive device comprising a fixed portion, at least one fixed electrode plate provided on the fixed portion, a movable portion resiliently supported on the fixed portion so as to move freely, at least one movable electrode plate provided on the movable portion, the fixed electrode plate and movable electrode plate being so disposed as to oppose each other in parallel relation, and means for applying a voltage across the fixed electrode plate and the movable electrode plate to produce an electrostatic force which drives the movable portion.

Further, the present invention provides a control circuit for controlling the drive of an electrostatic drive device which includes at least one fixed electrode plate provided on a fixed portion, and at least one movable electrode plate provided on a movable portion resiliently supported on the fixed portion so as to move freely, the fixed electrode plate and movable electrode plate being so disposed as to oppose each other in parallel relation, and the movable portion being driven by an electrostatic force produced by applying a voltage across the fixed electrode plate and the movable electrode plate, the control circuit comprising displacement command means for outputting a command signal which sets an amount of displacement of the movable electrode plate with respect to the fixed electrode plate, and converting means for linearizing, with respect to the command signal from the displacement command means, the amount of displacement of the movable portion displaced based on the command signal.

Accordingly, with the electrostatic drive device of the present invention, the movable portion is driven by an electrostatic force produced between the fixed electrode plate and the movable electrode plate.

Further, in accordance with the control circuit of the electrostatic drive device of the invention, the amount of displacement of the movable portion based on the command signal from the displacement command means is linearized with respect to the command signal.

In the electrostatic drive device according to the present invention, the movable portion is driven (displaced) by an electrostatic force produced between the two electrode plates without using a coil. As a result, no heat is produced by a coil, and therefore highly accurate positioning can be performed with little consumption of power. In addition, since the two electrode plates need only be arranged parallel to and in opposition to each other, the device can be made small in size and light in weight.

Moreover, the electrostatic drive device of the invention is such that the electrostatic force between the two electrode plates is proportional to the square of the applied voltage and is stable. Consequently, there is no variation in the amount of displacement caused by hysteresis or creep as in the case of a piezoelectric element, and therefore the control system for driving the movable portion is simplified.

In particular, the circuit for controlling the electrostatic drive device of the invention is such that the relationship between the command signal from the displacement command means and the amount of displacement of the movable portion is rendered linear. This makes it possible to simplify the control system even further.

Accordingly, even in a case where the control circuit of the invention is provided with a displacement sensor and the output of the sensor is fed back to perform closed-loop control for the purpose of attaining greater positioning accuracy, the control system will not be as complicated as that of the prior art.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 1 through 7 illustrate embodiments of an electrostatic drive device according to the present invention, in which:

FIG. 1 is a schematic plan view of the device;

FIG. 2 is a diagram for describing the arrangement of electrode plates;

FIGS. 3 and 4 are an explanatory view and a graph, respectively, for describing a control method;

FIGS. 5 and 6 are an explanatory view and a graph, respectively, for describing another control method; and FIG. 7 is a schematic plan view of an electrostatic drive device having a different construction;

DESCRIPTION OF THE PREFERRED EMBODIMENT

Embodiments of the present invention will now be described in detail with reference to the accompanying drawings of FIGS. 1 through 7.

Figure 1:
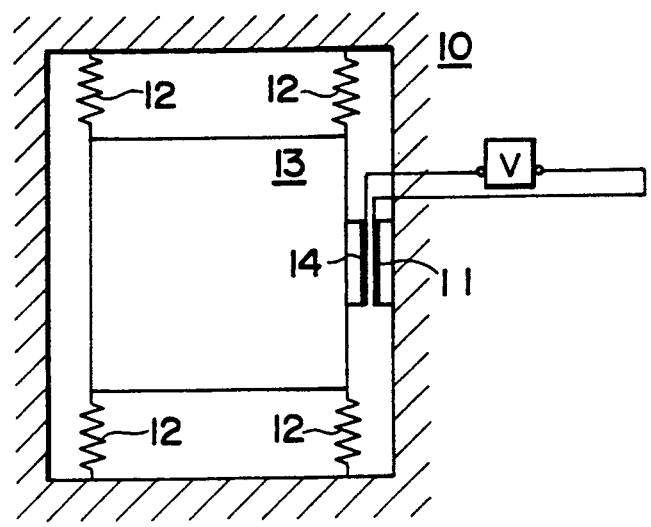

As shown in FIG. 1, an electrostatic drive device according to the present embodiment includes a fixed electrode plate 11 provided on a fixed portion 10, and a movable electrode plate 14 provided on a movable portion 13, which is resiliently supported on the fixed portion 10 by four coil springs 12 so as to move freely. The fixed electrode plate 11 and movable electrode plate 14 are so disposed as to oppose each other in parallel relation. A DC voltage V is applied across the fixed electrode plate 11 and the movable electrode plate 14.

Figure 2:
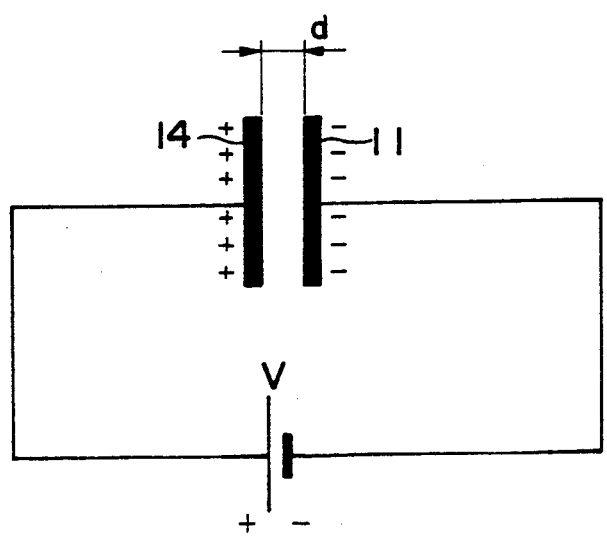
Figure 3:
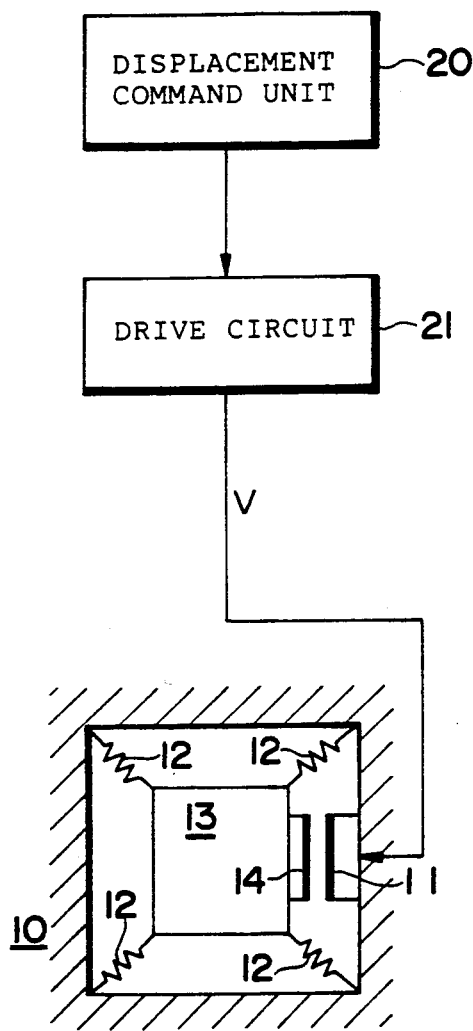

When the voltage V, which corresponds to a command signal from a displacement command unit 20, is impressed across the fixed electrode plate 11 and the movable electrode plate 14 via a drive circuit 21, as shown in FIG. 3, an electrostatic force F produced between the fixed electrode plate 11 and movable electrode plate 14 is obtained in accordance with the following equation:

$$F = \frac{\epsilon V^2}{2d^2} \cdot S (N) \quad (1)$$

where $\epsilon$ represents the dielectric constant between the electrode plates 11, 14, V the applied voltage, S the area over which the electrode plates 11, 14 oppose each other, and d the distance between the electrode plates 11, 14 (see FIG. 2).

It will be understood that the electrostatic force F increases in proportion to the square of the applied voltage V.

Letting K (N/$\mu$m) represent the spring constant of all four of the coil springs 12, the displacement X of the movable portion 13 will be given by the following:

$$X = \frac{F}{K} (\mu m) \quad (2)$$

Further, substituting Eq. (1) into Eq. (2) and rearranging, we have $$\begin{aligned} X &= \frac{\epsilon V^2 \cdot S}{2d^2 \cdot K} \\ &= \frac{\epsilon S}{2d^2 \cdot K} \cdot V^2 \\ &= AV^2 (\mu m) \end{aligned} \quad (3)$$

As a result, the movable portion 13 is displaced in proportion to the square of the applied voltage V. Accordingly, by adjusting the applied voltage V as desired, the movable portion 13 can be positioned at any desired position (see FIG. 4).

Figure 5:
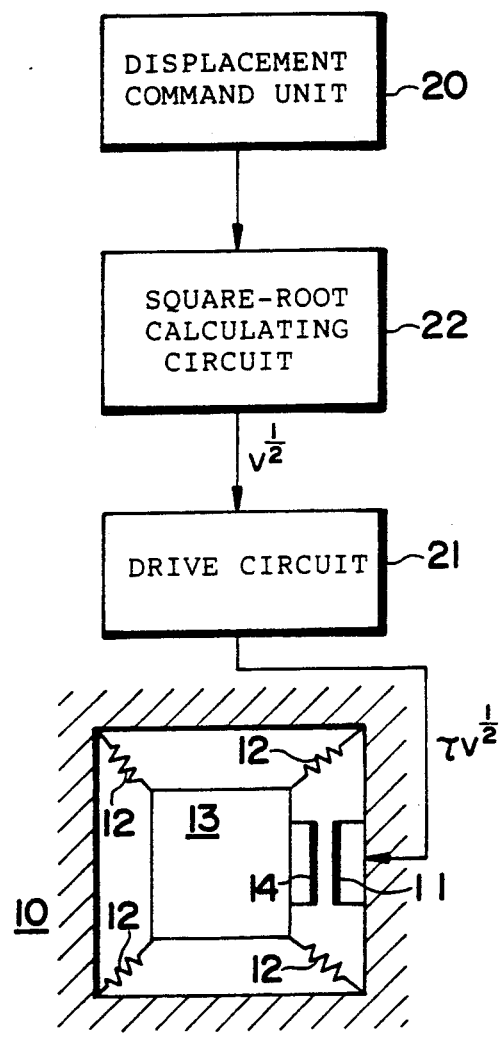
Figure 7:
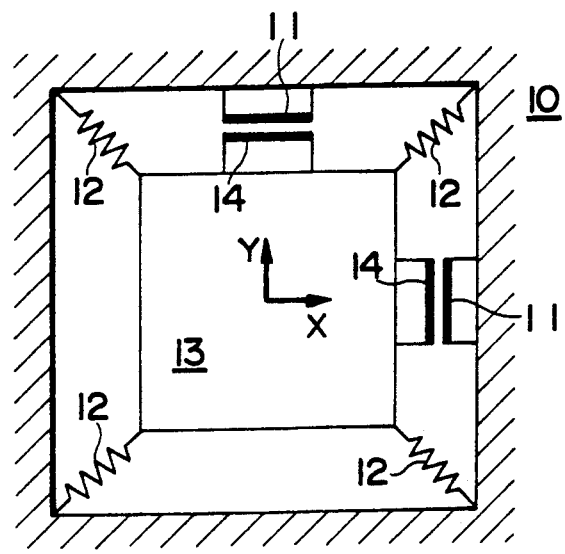
Figure 8:
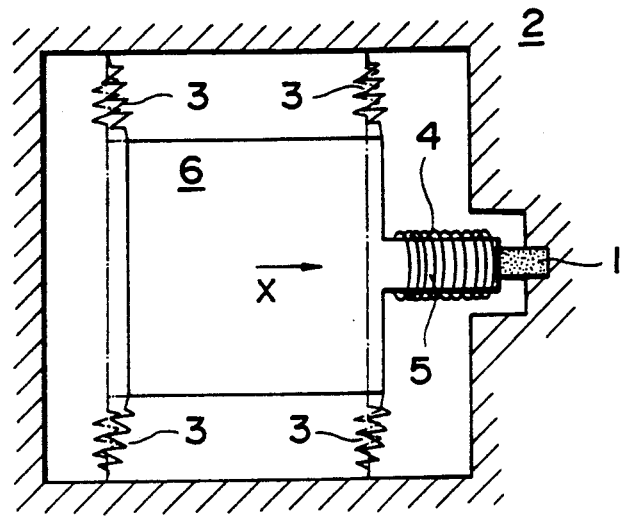
FIG. 8 is a schematic plan view for describing an example of a drive device according to an example of the prior art.
Figure 9:
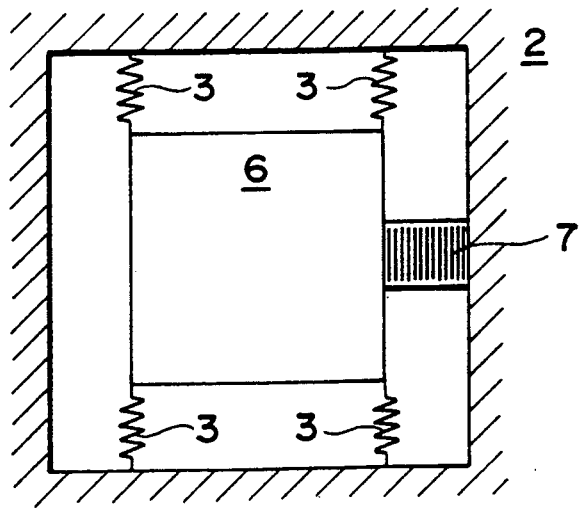
FIG. 9 is a schematic plan view for describing an example of a drive device according to another example of the prior art.

The control circuit is not limited to the above-described arrangement. For example, as shown in FIG. 5, a square-root calculating circuit 22 constituting converting means can be provided between the displacement command unit 20 and the drive circuit 21.

In accordance with the arrangement of this control circuit, a command voltage v for setting a desired amount of displacement is outputted by the displacement command unit 20, whereupon the square-root calculating circuit 22 converts the command voltage v into a voltage $v^{\frac{1}{2}}$ corresponding to the square root of the command voltage v. The voltage $v^{\frac{1}{2}}$ is delivered to the drive circuit 21, which amplifies this voltage to produce an output voltage $\tau v^{\frac{1}{2}}$. The latter is applied to the fixed electrode plate 11 and movable electrode plate 14.

Accordingly, the amount of displacement X of the movable portion 13 is as follows, from Eq. (3):

$$\begin{aligned} X &= AV^2 \\ &= A(\tau v^{\frac{1}{2}})^2 \\ &= A\tau^2 v \end{aligned} \quad (4)$$

Thus, the amount of deformation is linear with respect to the command voltage v (see FIG. 6)

As a result of the foregoing, precise position control can be carried out in a simple manner by an open loop. Moreover, even if a position sensor is provided and the output signal thereof is fed back to achieve closed-loop control for the purpose of performing positioning with even greater accuracy, the input-output relationship will be constant over the entire region. Accordingly, control parameters need not be changed again and again, and the control system can be kept simple.

An IC which includes a square-root calculating circuit, such as the AD 535 manufactured by Analog Devices Company, is an example of a device which can be employed as the converting means used in the present embodiment. It is possible also for the converting means to be constituted by a microcomputer. The displacement command unit 20 and drive circuit 21 also can be all or partially realized by a microcomputer or by suitable hardware circuitry.

Furthermore, though the foregoing embodiment is such that a non-linear signal amplified by the square root calculating circuit is amplified by the drive circuit 21 to drive the movable portion 13, it is permissible to adopt an arrangement in which the movable portion 13 is driven directly by the square-root calculating circuit.

The movable portion 13 is not limited to a planar square but can be of any shape. In addition, the fixed electrode plate 11 and movable electrode plate 14 are not limited to one of each. By providing the fixed electrode plate 11 and movable electrode plate 14 on two mutually adjacent sides of the fixed portion 10 and movable portion 13 (see FIG. 7), control can be performed in two dimensions.

Furthermore, the method of supporting the movable portion relative to the fixed portion is not limited to the resilient support relying upon coil springs. It goes without saying that other methods of support may be used.

As many apparently widely different embodiments of the present invention can be made without departing from the spirit and scope thereof, it is to be understood that the invention is not limited to the specific embodiments thereof except as defined in the appended claims.

What is claimed is:

1. An electrostatic drive device comprising:
    a fixed portion;
    at least one fixed electrode plate provided on said fixed portion;
    a movable portion resiliently supported to said fixed portion so as to move freely;
    at least one movable electrode plate provided on said movable portion, said movable electrode plate having first and second opposing sides, said movable electrode plate being attached to said movable portion at said first side and facing a respective said fixed electrode in a parallel relationship at said second side each of said movable and respective fixed electrode plates forming a pair of electrode plates; and,
    means for applying a voltage across said pair of electrode plates to produce electrostatic forces which drive said movable portion.

2. A control circuit for controlling the drive of an electrostatic drive device which includes at least one fixed electrode plate provided on a fixed portion of said drive device, and at least one movable electrode plate provided on a movable portion of said drive device, said movable portion being resiliently supported to the fixed portion so as to move freely, the fixed electrode plate and movable electrode plate being so disposed as to oppose each other in parallel relation, and the movable portion being driven by an electrostatic force produced by applying a voltage across the fixed electrode plate and the movable electrode plate, said control circuit comprising:
    displacement command means for outputting a command signal which sets an amount of displacement of the movable electrode plate with respect to the fixed electrode plate; and
    converting means responsive to said command signal for providing said voltage across said fixed electrode plate and said movable electrode plate, said converting means operating on the command signal from said displacement command to linearize the amount of displacement of the movable portion based on said command signal.

* * * * *